United States Patent
Zhang (10) Patent No.: US 11,609,293 B2
(45) Date of Patent: Mar. 21, 2023

(54) FAT SATURATION TECHNIQUE WITH LINEAR FLEXIBLE REORDERING AND BLOCH EQUATION CALCULATION TECHNIQUES

(71) Applicant: Siemens Healthcare GmbH, Erlangen (DE)

(72) Inventor: Qiong Zhang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/344,104

(22) Filed: Jun. 10, 2021

(65) Prior Publication Data

US 2021/0389403 A1    Dec. 16, 2021

(30) Foreign Application Priority Data

Jun. 11, 2020 (CN) .......................... 202010527772.6

(51) Int. Cl.
*G01V 3/00* (2006.01)
*G01R 33/56* (2006.01)
*G01R 33/48* (2006.01)

(52) U.S. Cl.
CPC ....... *G01R 33/5607* (2013.01); *G01R 33/482* (2013.01); *G01R 33/5608* (2013.01)

(58) Field of Classification Search
CPC .............. G01R 33/3415; G01R 33/543; G01R 33/5659; G01R 33/36; A61B 5/055
USPC ........................................................ 324/309
See application file for complete search history.

(56) References Cited

U.S. PATENT DOCUMENTS

| | | | | |
|---|---|---|---|---|
| 4,675,847 A | * | 6/1987 | Birnbaum | G11C 27/04 365/183 |
| 7,689,263 B1 | | 3/2010 | Fung et al. | |
| 2004/0127786 A1 | | 7/2004 | Schmit et al. | |
| 2007/0225591 A1 | | 9/2007 | Derbyshire et al. | |
| 2009/0091324 A1 | * | 4/2009 | Sugiura | G01R 33/4828 324/309 |
| 2012/0112743 A1 | | 5/2012 | Granlund et al. | |
| 2013/0134977 A1 | * | 5/2013 | Iwadate | G01R 33/4818 324/318 |
| 2016/0047874 A1 | * | 2/2016 | Grodzki | G01R 33/5635 324/309 |

FOREIGN PATENT DOCUMENTS

| | | |
|---|---|---|
| CN | 103300858 A | 9/2013 |
| EP | 2390677 A1 | 11/2011 |

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

The data acquisition device may include a fat-suppression pulse exertion module configured to exert a fat-suppression pulse on an imaging area at set intervals, the fat-suppression pulse being able to suppress an initial fat signal to a negative value and keep the fat signal corresponding to the intermediate echo datum of the echo data collected between two fat-suppression pulses within [0, a], and a being a preset threshold close to 0, and an excitation and acquisition module, configured to exert a radio frequency pulse train and a series of phase encoding gradients after each fat-suppression pulse, collect the corresponding echo data, and fill the echo data into K-space in linear filling mode.

7 Claims, 6 Drawing Sheets

FAT SATURATION TECHNIQUE WITH LINEAR FLEXIBLE REORDERING AND BLOCH EQUATION CALCULATION TECHNIQUES

CROSS REFERENCE TO RELATED APPLICATIONS

This patent application claims priority to Chinese Patent Application No. 202010527772.6, filed Jun. 11, 2020, which is incorporated herein by reference in its entirety.

BACKGROUND

Field

The present disclosure relates to the technical field of magnetic resonance imaging, in particular to a data acquisition device and method, and a magnetic resonance imaging device.

Related Art

MRI is a technique using the magnetic resonance phenomenon for imaging. The principle of magnetic resonance imaging is mainly as follows: For an atomic nucleus containing an odd number of protons, for example, the hydrogen atomic nucleus widely existing in human bodies, the protons spin like a small magnet, and in addition, the spin axes of these small magnets are irregular. If an external magnetic field is exerted, these small magnets will be re-arranged along the lines of magnetic force of the external magnetic field, to be specific, arranged in two directions parallel and anti-parallel to the lines of magnetic force. The direction parallel to the lines of magnetic force of the external magnetic field is called the positive longitudinal axis and the direction anti-parallel to the lines of magnetic force of the external magnetic field is called the negative longitudinal axis. The atomic nucleus has only a longitudinal magnetization component and the longitudinal magnetization component has not only a direction but also an amplitude. RF pulses having a specific frequency are used to excite the nucleus in the external magnetic field so that the spin axis of the nucleus deviates from the positive longitudinal axis or negative longitudinal axis to produce a resonance. This is called a magnetic resonance phenomenon. After the spin axis of the excited nucleus deviates from the positive longitudinal axis or negative longitudinal axis, the nucleus has a transverse magnetization component.

After the emission of RF pulses is stopped, the excited atomic nucleus emits echo signals and releases the absorbed energy in the form of electromagnetic waves, and the phase and the energy level are both recovered to the state before excitation. After further processing, such as space encoding, of echo signals emitted by the atomic nucleus, an image can be reconstructed. The process of the recovery of the excited atomic nucleus to the state before excitation is called relaxation process, and the time required for the recovery to an equilibrium state is called relaxation time.

Since hydrogen atomic nuclei in fat and hydrogen atomic nuclei in water in the human body are located in different molecular environments, when excited by the same RF pulse, they will have different resonance frequencies and different relaxation times. When signals are collected at different points of echo time, the fat tissue and water have different phases and signal intensities. To obtain a clear image having a good image contrast, so far, different fat suppression methods have been adopted to suppress signals of fat (referred to as fat signals) in a human body under test as undesired signals.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIGS. 6A and 6B show the changes of the fat signals and the amplitudes when the flip angle is changed from 90° to 180° and a fat-suppression pulse is exerted according to exemplary embodiments. FIG. 6A shows the fat signals.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

Figure 1:
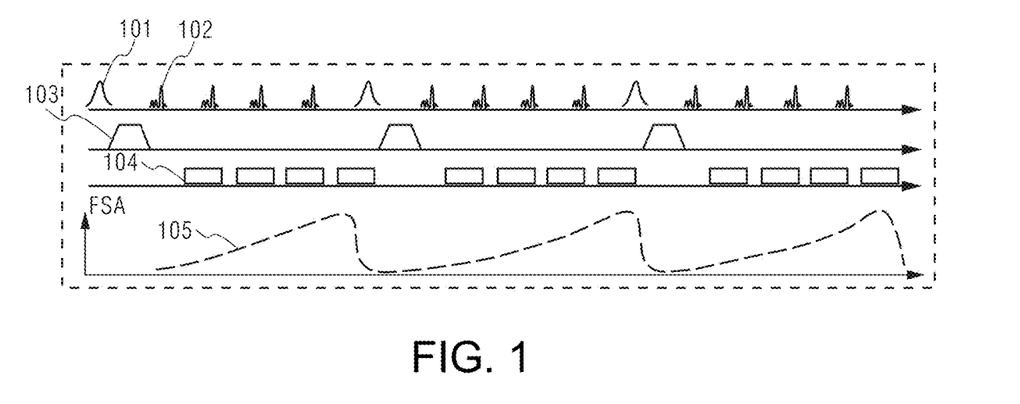
FIG. 1 shows echo data acquisition based on fast fat suppression according to an exemplary embodiment.

FIG. 1 shows the echo data acquisition based on fast fat suppression. As shown in FIG. 1, a fat-suppression pulse 101 for suppressing fat signals is first exerted in the first layer, and then a series of exciting pulses 102, or an RF pulse train is exerted before fat signals are suppressed and completely recovered. For the convenience of understanding, only four exciting pulses are given in the figure. In practical applications, the number of exciting pulses is determined as required. The second layer is spoiled gradients 103. The third layer is echo data 104, where the number of echo data is consistent with the number of exciting pulses and each echo datum is a readout collected echo signal. The fourth layer is fat signals 105, and the longitudinal axis is the fat signal amplitude (FSA). It can be seen that fat signals are suppressed to zero each time a fat-suppression pulse is exerted, and later the fat signals suppressed to zero will slowly be recovered. The degree of recovery of fat signals, namely, the level of fat signals, depends on the time elapsed from the exertion of the fat-suppression pulse.

The above-mentioned fat signals will be slowly recovered after being suppressed, however. If more fat-suppression pulses are exerted, more time will be consumed. Therefore, there is always a problem about how to achieve a balance between the scanning time and the image contrast.

An object of the present disclosure provide a data acquisition device and method in one aspect, and provide a magnetic resonance imaging device in another aspect so as to improve the image contrast without increasing fat-suppression pulses.

A data acquisition device provided in the embodiments of the present disclosure comprises a fat-suppression pulse exertion module (fat-suppression pulse exertion generator), configured to exert a fat-suppression pulse on an imaging area at set intervals, the fat-suppression pulse being able to suppress an initial fat signal to a negative value and keep the fat signal corresponding to the intermediate echo datum of the echo data collected between two fat-suppression pulses within [0, a], and a being a preset threshold close to 0, and an excitation and acquisition module (excitation and acquisition generator), configured to exert an RF pulse train and a series of phase encoding gradients after each fat-suppression pulse, collect the corresponding echo data, and fill the echo data into a K-space in linear filling mode.

In one implementation mode, the data acquisition device further comprises a fat-suppression pulse determination processor, configured to determine the flip angle of a fat-suppression pulse by following the principle that the fat signal corresponding to the intermediate echo datum of the echo data collected between the two fat-suppression pulses is kept within [0, a], and the fat-suppression pulse exertion module (fat-suppression pulse exertion generator) exerts a fat-suppression pulse having the flip angle on an imaging area at the set intervals.

In one implementation mode, when calculating the flip angle value of a fat-suppression pulse for an echo within the standard echo train length, if the condition that the fat signal corresponding to the intermediate echo datum is kept within [0, a] cannot be satisfied, the fat-suppression pulse determination processor reduces the echo train length, alternately extracts group members to divide the echoes within the standard echo train length into at least two echo groups, and calculates the flip angle value of the fat-suppression pulse for each echo group.

In one embodiment, the fat-suppression pulse determination processor comprises: a first processor, configured to set the flip angle of a fat-suppression pulse to 180° and calculate fat signals in all echoes within an echo train length, a determination unit, configured to compare the echo No. $M_{min}$ of the lowest fat signal with the echo No. $M_c$ corresponding to the K-space center, send a first processing notification to a second processor if $M_c \leq M_{min}$, and send a second processing notification to a third processor if $M_c > M_{min}$, the second processor, configured to reduce the flip angle of the fat-suppression pulse at the set intervals according to the first processing notification and calculate fat signals in all echoes within an echo train length until the fat signal at $M_c$ is the minimum or sufficiently close to the minimum, and the flip angle of the corresponding fat-suppression pulse at this time is the final flip angle, and the third processor, configured to reduce the echo train length according to the second processing notification, alternately extract group members to divide the echoes within the standard echo train length into at least two echo groups, instruct the first processor to perform the operations of setting the flip angle of the fat-suppression pulse to 180° based on the reduced echo train length, and calculating fat signals in all echoes within a fat-suppression echo train length M.

In one implementation mode, calculating fat signals in all echoes within an echo train length is calculating fat signals in all echoes within an echo train length according to the following formulas:

$$Mz_n^+ = Mz_n^- * \cos(\beta)$$

$$Mz_{e1}^- = Mz_n^+ * e^{-\frac{t1}{T1}} + M_0(1 - e^{-\frac{t1}{T1}})$$

$$Mz_{ei}^- = Mz_{ei-1}^- * \cos(\theta) e^{-\frac{t3}{T1}} + M_0(1 - e^{-\frac{t3}{T1}})$$

$$Mz_{ei}^+ = Mz_{ei}^- * \cos(\theta)$$

$$M_{xy}^{ei} = Mz_{ei}^+ * \sin(\theta) * e^{-\frac{t2}{T2}}$$

where, i=2, 3, ..., m; $\beta$ is the flip angle of a fat-suppression pulse, $\theta$ is the excitation angle of an exciting pulse, $Mz_n^-$ is the longitudinal magnetization vector of fat at the $n^{th}$ point of time, $Mz_n^+$ is obtained after flipping $Mz_n^-$ a flip angle $\beta$, $Mz_{ei}^-$ is the longitudinal magnetization vector of fat at the $i^{th}$ RF pulse, $Mz_{ei}^+$ is obtained after flipping $Mz_{ei}^-$ an excitation angle $\theta$; T1 is the longitudinal relaxation time of fat, T2 is the transverse relaxation time of fat, t1 is the time interval between the fat-suppression pulse and a first RF pulse, t2 is the echo time, and t3 is the echo interval; M0 is the magnetization vector in a thermal equilibrium state, $M_{xy}^{ei}$ is the transverse magnetization vector of fat at the $i^{th}$ echo datum, and m is the echo train length.

A magnetic resonance imaging device provided in the embodiments of the present disclosure comprises the data acquisition device described in any of above-mentioned implementation modes.

A data acquisition method provided in the embodiments of the present disclosure comprises: exerting a fat-suppression pulse on an imaging area at set intervals, where the fat-suppression pulse is able to suppress an initial fat signal to a negative value and keep the fat signal corresponding to the intermediate echo datum of the echo data collected between two fat-suppression pulses within [0, a], and a is a preset threshold close to 0, and exerting an RF pulse train and a series of phase encoding gradients after each fat-suppression pulse, collecting the corresponding echo data, and filling the echo data into a K-space in linear filling mode.

In one implementation mode, before exerting a fat-suppression pulse on an imaging area at set intervals, the method further comprises determining the flip angle of a fat-suppression pulse by following the principle that the fat signal corresponding to the intermediate echo datum of the echo data collected between the two fat-suppression pulses is kept within [0, a], and exerting a fat-suppression pulse on an imaging area at set intervals is exerting a fat-suppression pulse having the flip angle on an imaging area at set intervals.

In one implementation mode, determining the flip angle of a fat-suppression pulse by following the principle that the fat signal corresponding to the intermediate echo datum of the echo data collected between the two fat-suppression pulses is kept within [0, a] comprises: setting the flip angle of a fat-suppression pulse to 180° and calculating fat signals in all echoes within an echo train length M; reducing the flip angle of the fat-suppression pulse at the set intervals when the echo No. $M_c$ corresponding to the K-space center is less than or equal to the echo No. $M_{nin}$ of the lowest fat signal, and calculating fat signals in all echoes within an echo train length until the fat signal at $M_c$ is the minimum or sufficiently close to the minimum, and the flip angle of the corresponding fat-suppression pulse at this time is the final flip angle; reducing the echo train length and alternately extracting group members to divide the echoes within the standard echo train length METL into at least two echo groups when the corresponding echo No. $M_c$ of the K-space center is greater than the lowest echo No. $M_{nin}$ of fat signals, and then going back to the step of setting the flip angle of a fat-suppression pulse to 180° and calculating fat signals in all echoes within an echo train length M.

In one implementation mode, calculating fat signals in all echoes within an echo train length is calculating fat signals in all echoes within an echo train length according to the following formulas:

$$Mz_n^+ = Mz_n^- * \cos(\beta)$$

$$Mz_{e1}^- = Mz_n^+ * e^{-\frac{t1}{T1}} + M_0(1 - e^{-\frac{t1}{T1}})$$

$$Mz_{ei}^- = Mz_{ei-1}^+ * \cos(\theta) e^{-\frac{t3}{T1}} + M_0(1 - e^{-\frac{t3}{T1}})$$

$$Mz_{ei}^+ = Mz_{ei}^- * \cos(\theta)$$

$$M_{xy}^{ei} = Mz_{ei}^+ * \sin(\theta) * e^{-\frac{t2}{T2}}$$

where, i=2, 3, . . . , m; β is the flip angle of a fat-suppression pulse, θ is the excitation angle of an exciting pulse, $Mz_n^-$ is the longitudinal magnetization vector of fat at the $n^{th}$ point of time, $Mz_n^+$ is obtained after flipping $Mz_n^-$ a flip angle β, $Mz_{ei}^-$ is the longitudinal magnetization vector of fat at the $i^{th}$ RF pulse, $Mz_{ei}^-$ is obtained after flipping $Mz_{ei}^-$ an excitation angle θ; T1 is the longitudinal relaxation time of fat, T2 is the transverse relaxation time of fat, t1 is the time interval between the fat-suppression pulse and a first RF pulse, t2 is the echo time, and t3 is the echo interval; M0 is the magnetization vector in a thermal equilibrium state, $M_{xy}^{ei}$ is the transverse magnetization vector of fat at the $i^{th}$ echo datum, and m is the echo train length.

From the above-mentioned solution, it can be seen that in the embodiments of the present disclosure, a fat-suppression pulse suppressing fat signals to zero or a value close to zero is exerted when an intermediate echo datum is collected, that is to say, the fat-suppression pulse first suppresses fat signals to a set negative value, instead of zero, and then an RF pulse train is exerted during the period of the suppression of fat signals and the recovery to a set positive value. In this way, echo data of low fat signals L is just located at the central area of a K-space at the time of linear filling of the K-space. In addition, since fat signals are mainly located near a zero value, the fat suppression effect is better than that of a solution based on the increase of fat signals of an existing fat-suppression pulse from a zero value to a positive value or a solution based on the increase of fat signals of a new fat-suppression pulse from a negative value to a second positive value.

In addition, when the flip angle of a fat-suppression pulse is calculated for echoes within the normal echo train length (ETL), if the condition that the corresponding fat signal of the intermediate echo datum is 0 or close to 0 cannot be satisfied, the ETL is reduced, group members are alternately extracted to divide the echoes within the normal echo train length (ETL) into at least two echo groups, and the flip angle of the fat-suppression pulse exerted for each echo group can be obtained.

MRI involves the images of various cross-sections in expected directions. A K-space is a data space of each cross-section, that is, K-space data represents a group of raw data which may form an image. For example, echo data is filled into a phase-encoded K-space after a three-dimensional fast gradient echo sequence is used for collecting echo data of a K-space. Later, an expected image may be obtained after a Fourier transform of K-space data.

Figure 2A:
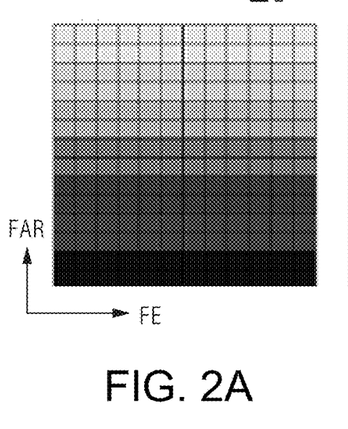
FIGS. 2A to 2C show the distributions of echo signals in different K-space filling modes according to exemplary embodiments.
Figure 2B:
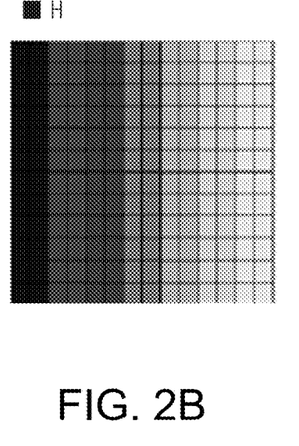
Figure 2C:
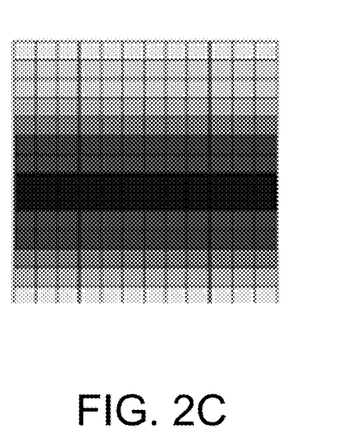

In the embodiments of the present disclosure, the three filling modes shown in FIGS. 2A to 2C are mainly adopted to fill a K-space. FIGS. 2A and 2B show linear filling and FIG. 2C shows pseudo intermediate sequence filling. As shown in FIGS. 2A to 2C, the dark areas are echo data of low fat signals L and the light areas are echo data of high fat signals H. The horizontal coordinate represents phase encoding (PE) in the phase encoding direction, and the longitudinal coordinate represents phase encoding in the layer selection direction. It can be seen that a filling sequence from the bottom up is adopted in FIG. 2A, a filling sequence from left to right is adopted in FIG. 2B, and a filling sequence from the center to the upper and lower sides is adopted in FIG. 2C. For the filling sequence in FIG. 2A, echo data of lowest fat signals is located at the bottom of the K-space, for the filling sequence in FIG. 2B, echo data of lowest fat signals is located on the left of the K-space, and for the filling sequence in FIG. 2C, echo data of lowest fat signals is located at the central bar between the upper and lower parts of the K-space.

After comparisons, the inventor of the present disclosure found that the image contrasts of MRI images reconstructed in different filling directions are different. The image contrast of the reconstructed MRI image corresponding to the filling sequence in FIG. 2C is better than the image contrasts of the reconstructed MRI images corresponding to the linear filling mode in FIGS. 2A and 2B. However, the filling sequence from the center to the upper and lower sides is more complex than the linear filling sequence. For this reason, a new echo data acquisition solution is proposed in the embodiments of the present disclosure, that is, a fat signal is exerted, that is, a fat-suppression pulse suppressing fat signals to a set negative value, instead of zero, is exerted, and then an RF pulse train is exerted during the period of the suppression of fat signals and the recovery to a set positive value. The size of the fat-suppression pulse is calculated according to the standard that the fat signal is 0 or close to 0 when corresponding echo data of the intermediate RF pulse of the RF pulse train are collected. In this way, echo data of low fat signals L is just located at the central area of a K-space at the time of linear filling of the K-space. In addition, since fat signals are mainly located near a zero value, the fat suppression effect is better than that of a solution based on the increase of fat signals of an existing fat-suppression pulse from a zero value to a first positive value or a solution based on the increase of fat signals of a new fat-suppression pulse from a negative value to a second positive value.

To make clearer the objects, technical solutions, and advantages of the present disclosure, the following gives embodiments to further describe the present disclosure in detail.

Figure 3:
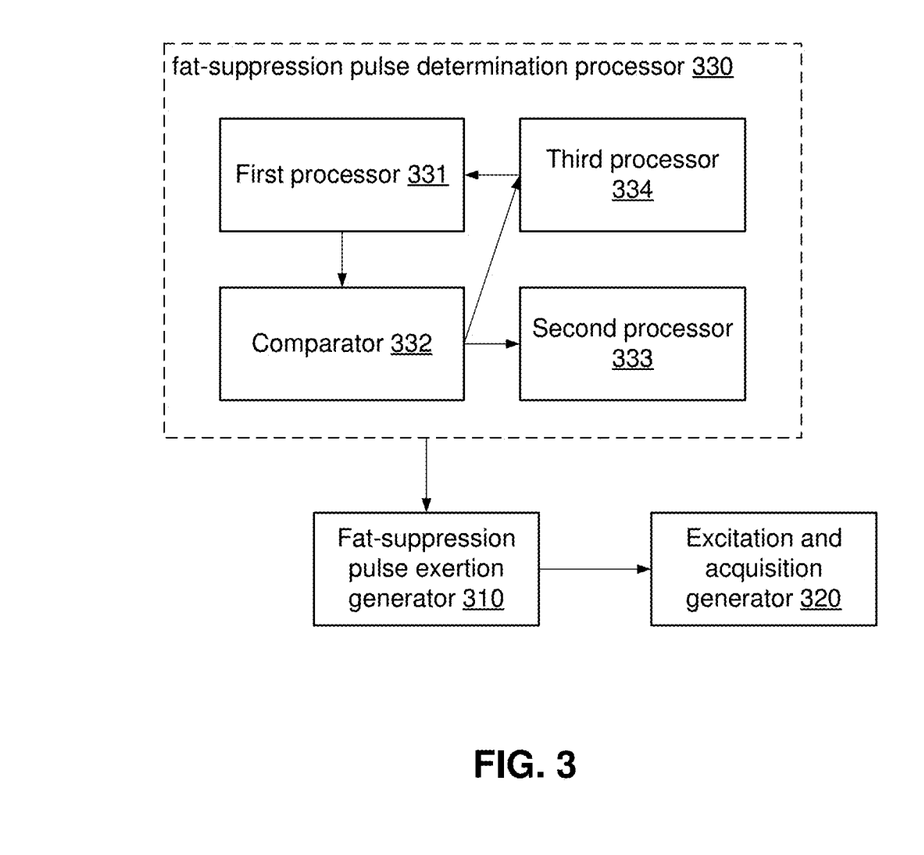
FIG. 3 shows a data acquisition device according to an exemplary embodiment.

FIG. 3 shows the structure of a data acquisition device in the embodiments of the present disclosure. As indicated by solid line boxes in FIG. 3, the data acquisition device may comprise a fat-suppression pulse exertion generator 310 and an excitation and acquisition generator 320. In an exemplary embodiment, the fat-suppression pulse exertion generator 310 and/or excitation and acquisition generator 320 include processing circuitry that is configured to perform one or more respective functions/operations of the fat-suppression pulse exertion generator 310 and excitation and acquisition generator 320.

In an exemplary embodiment, the fat-suppression pulse exertion generator 310 is configured to exert a fat-suppression pulse on an imaging area at set intervals, the fat-suppression pulse is able to suppress an initial fat signal to a negative value and keep the fat signal corresponding to the intermediate echo datum of the echo data collected between two fat-suppression pulses at 0 or close to 0, for example, keep the fat signal corresponding to the intermediate echo datum of the echo data collected between two fat-suppression pulses within [0, a], and a is a preset threshold close to 0, for example, 0.1.

Figure 4:
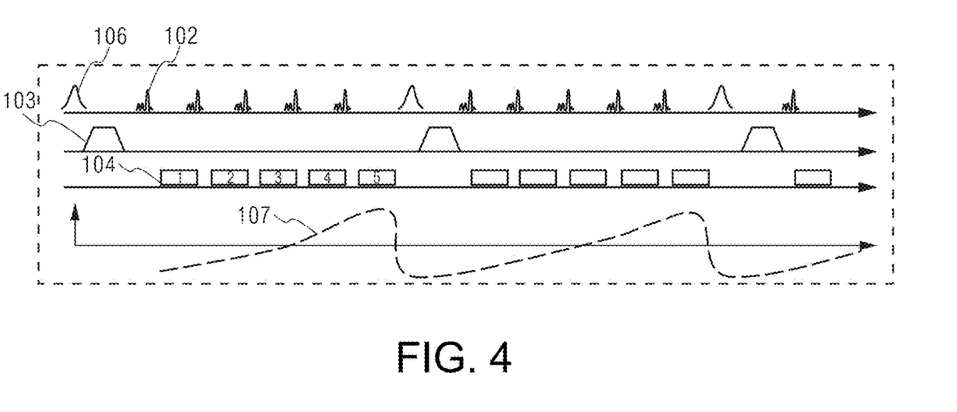
FIG. 4 shows echo data acquisition based on new fat suppression according to an exemplary embodiment.

FIG. 4 shows echo data acquisition based on new fat suppression in one example of the present disclosure. In the present example, an RF pulse train comprises 5 RF pulses. As shown in FIG. 4, it can be seen from the fourth layer, fat signal layer 107, that each time a fat-suppression pulse 106 is exerted, a fat signal 107 is suppressed to a negative value; then, the fat signal 107 suppressed to a negative value starts recovering slowly, and the fat signal is 0 or close to 0 when the corresponding fat signal of the intermediate echo datum 3 is collected, and then, the fat signal becomes a positive value when the last echo datum 5 is collected.

Figure 5:
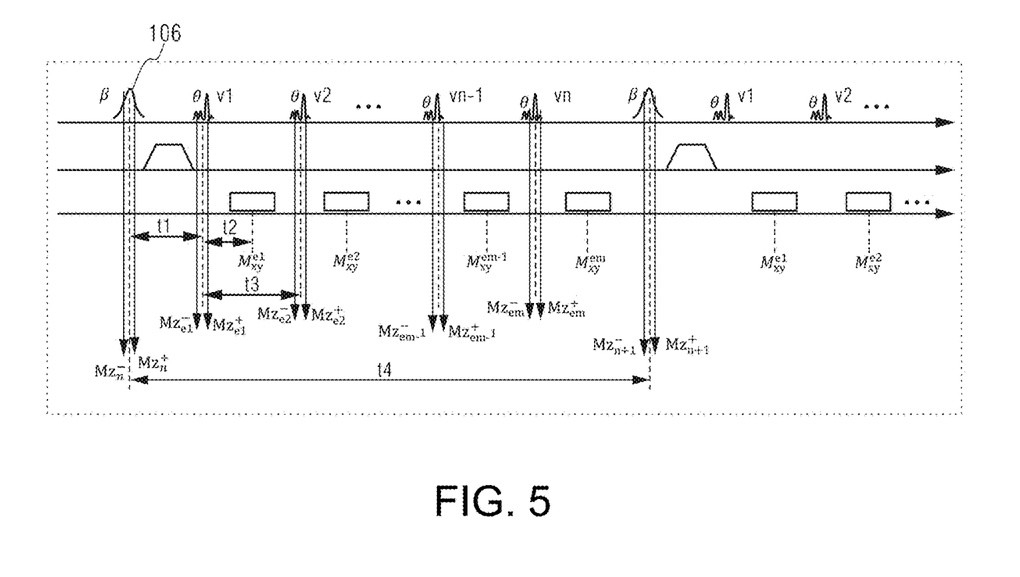
FIG. 5 shows the calculation of the flip angle of a fat-suppression pulse according to an exemplary embodiment.

In specific calculations, in order to achieve the effect that the corresponding fat signal of the intermediate echo datum collected after each fat-suppression pulse is 0 or close to 0, the flip angle of the fat-suppression pulse can be calculated according to formulas (1) to (5) below in combination with FIG. 5:

$$Mz_n^+ = Mz_n^- * \cos(\beta) \quad (1)$$

$$Mz_{e1}^- = Mz_n^+ * e^{-\frac{t1}{T1}} + M_0(1 - e^{-\frac{t1}{T1}}) \quad (2)$$

$$Mz_{ei}^- = Mz_{ei-1}^- * \cos(\theta)e^{-\frac{t3}{T1}} + M_0(1 - e^{-\frac{t3}{T1}}) \quad (3)$$

$$Mz_{ei}^+ = Mz_{ei}^- * \cos(\theta) \quad (4)$$

$$M_{xy}^{ei} = Mz_{ei}^+ * \sin(\theta) * e^{-\frac{t2}{T2}} \quad (5)$$

where, i=2, 3, ..., m; $\beta$ is the flip angle of a fat-suppression pulse, $\theta$ is the excitation angle of an exciting pulse, $Mz_n^-$ is the longitudinal magnetization vector of fat at the $n^{th}$ point of time, $Mz_n^+$ is obtained after flipping $Mz_n^-$ a flip angle $\beta$, $Mz_{ei}^-$ is the longitudinal magnetization vector of fat at the $i^{th}$ RF pulse, $Mz_{ei}^+$ is obtained after flipping $Mz_{ei}^-$ an excitation angle $\theta$; T1 is the longitudinal relaxation time of fat, T2 is the transverse relaxation time of fat, t1 is the time interval between the fat-suppression pulse and a first RF pulse, t2 is the echo time and is defined as the time interval it takes an exciting pulse to arrive at the central point of a K-space and t3 is the echo interval and is defined as the time interval between two echoes; M0 is the magnetization vector in a thermal equilibrium state, and m is the echo train length.

Since the transverse magnetization vector of fat is in direct proportion to fat signals, the corresponding $$M_{xy}^{em/2} = Mz_{em/2}^+ * \sin(\theta) * e^{-\frac{t2}{T2}} \approx 0$$

value is the value of the determined flip angle of the fat-suppression pulse when $$M_{xy}^{em/2} = Mz_{em/2}^+ * \sin(\theta) * e^{-\frac{t2}{T2}} \approx 0.$$

In other implementation modes, as indicated by the dotted-line box in FIG. 3, the data acquisition device may further comprise a fat-suppression pulse determination processor 330, configured to determine the flip angle of a fat-suppression pulse by following the above-mentioned process, namely, the principle that the fat signal corresponding to the intermediate echo datum of the echo data collected between the two fat-suppression pulses is 0 or close to 0. Accordingly, the fat-suppression exertion generator 310 is configured to exert a fat-suppression pulse having the flip angle on an imaging area at first set intervals. In an exemplary embodiment, the fat-suppression pulse determination processor 330 includes processing circuitry that is configured to perform one or more of the functions/operations of the fat-suppression pulse determination processor 330. One or more of the components of the fat-suppression pulse determination processor 330 (e.g. 331, 332, 333, 334) may also include processing circuitry configured to perform the respective functions/operations of the component(s).

In the present embodiment, in the $n^{th}$ fat suppression period, the longitudinal magnetization of fat starts with the initial magnetization $Mz_n^-$, and in the $(n+1)^{th}$ fat suppression period, the longitudinal magnetization of fat starts with the result of the longitudinal magnetization of fat in the $(n+1)^{th}$ fat suppression period, that is to say, formula (4) below is satisfied:

$$Mz_{n+1}^- = Mz_{em}^- * \cos(\theta) * e^{-\frac{t3}{T1}} + M_0(1 - e^{-\frac{t3}{T1}}) \quad (6)$$

Fat signals oscillate only in the first echo train lengths (ETLs), and after that, fat signals periodically repeat. That is to say, fat signals go into steady state incoherent motion between ETLs. The first dozens of ETLs are ignored and it may be assumed that fat signals go into a steady state in each ETL. Then, the following formula holds:

$$Mz_{n+1}^- = Mz_n^- = Mz_{SSI}^- \quad (7)$$

Figure 6A:
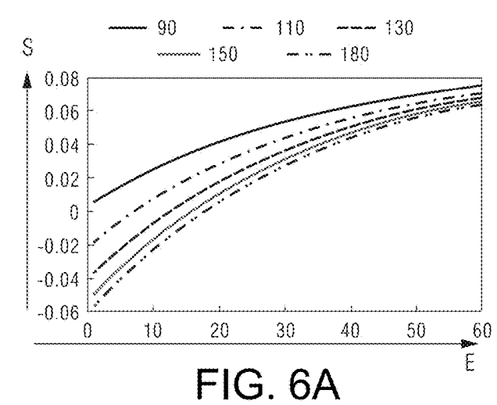
Figure 6B:
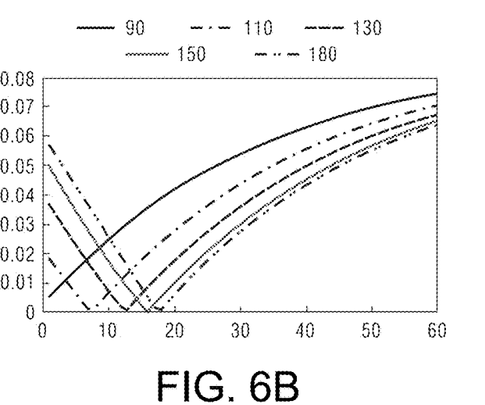
FIG. 6B shows the changes of the amplitudes of the fat signals obtained after the modulus operation of fat signals shown in FIG. 5A.

FIGS. 6A and 6B show the changes of the fat signals and the amplitudes when the flip angle is changed from 90° to 180° and a fat-suppression pulse is exerted in one example. FIG. 6A shows the fat signals S, and FIG. 6B shows the changes of the amplitudes A of the fat signals obtained after the modulus operation of fat signals shown in FIG. 5A. The horizontal coordinates in FIGS. 6A and 6B both represent the number of echoes in an ETL, and the longitudinal coordinate in FIG. 6A represents the value of fat signals S. It can be seen that the corresponding fat suppression effects of different flip angles are different.

The excitation and acquisition generator 320 is configured to exert an RF pulse train and a series of phase encoding gradients after each fat-suppression pulse, collect the corresponding echo data, and fill the echo data into a K-space in linear filling mode.

In one implementation mode of the present disclosure, when calculating the flip angle value of a fat-suppression pulse for an echo $M_{ETL}$ within the normal echo train length (ETL), if the condition that the fat signal corresponding to the intermediate echo datum is 0 or close to 0 cannot be satisfied, the fat-suppression pulse determination processor 330 may reduce the echo train length. The ETL may be reduced according to the following formula:

$$M = \frac{M_{ETL}}{n}, (n = 1, 2, 3, \dots) \quad (8)$$

It can be seen that the above-mentioned ETL is reduced by multiples. In order to match the existing K-space and keep the intermediate echo datum of echo data within the reduced ETL located at the center of the K-space, group members are alternately extracted at equal intervals according to the reduction multiple of the ETL to divide the echoes within the normal ETL into corresponding echo groups, namely, at least two echo groups, usually two echo groups or three echo groups. For example, if n=2, the original ETL is 10 and the echoes within an ETL of 10 are divided into two groups, one echo group may consist of the first, third, fifth, seventh and ninth echoes, and the other echo group may consist of the second, fourth, sixth, eighth and tenth echoes. For example again, if n=3, the ETL is 15 and the echoes within an ETL of 15 are divided into three groups, then the first echo group may consist of the first, fourth, seventh, tenth and thirteenth echoes, the second echo group may consist of the second, fifth, eighth, eleventh and fourteenth echoes, and the third echo group may consist of the third, sixth, ninth, twelfth and fifteenth echoes. After that, the flip angle of the fat-suppression pulse exerted before each echo group is so calculated for the echo group that the fat signal corresponding to the intermediate echo datum of echo data in the echo group is 0 or close to 0.

The phase encoding gradients exerted for different echoes are different.

Figure 7A:
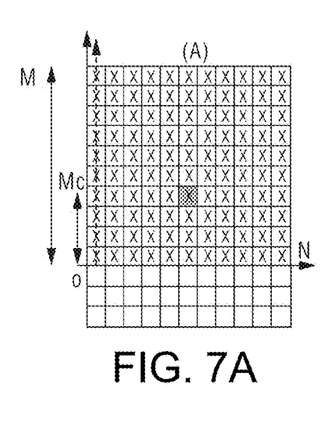
FIGS. 7A to 7C show linear filling of a K-space from the bottom up according to an exemplary embodiment.

FIG. 7A shows linear filling of a K-space from the bottom up in an example of the present disclosure.

Figure 7B:
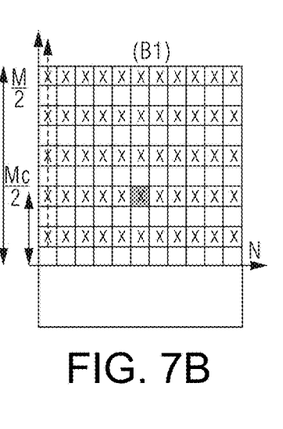
Figure 7C:
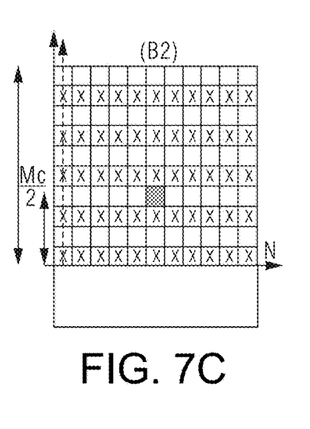

In addition, in the case that echoes within an ETL are divided into at least two echo groups, for example, echoes within an ETL of 10 are divided into two groups, for the echo group consisting of the second, fourth, sixth, eighth and tenth echoes, the collected echo data are the second, fourth, sixth, eighth and tenth echo data, and FIG. 7B shows the filling of the echo data into a K-space; for the echo group consisting of the first, third, fifth, seventh and ninth echoes, the collected echo data are the first, third, fifth, seventh and ninth echoes, and FIG. 7C shows the filling of the echo data into the K-space. That is to say, after the K-space is filled as shown in FIGS. 7B and 7C, the K-space shown in FIG. 7A can be obtained.

In the specific implementation, the fat-suppression pulse determination processor 330 may further comprise a first processor 331, a determination unit (comparator) 332 and a second processor 333 and a third processor 334.

The first processor 331 is configured to set the flip angle of a fat-suppression pulse to 180°, calculate fat signals in all echoes within an echo train length M according to formulas (1) to (5), mark the echo No. of the lowest echo signal as $M_{nin}(R_0)$ and mark the echo No. corresponding to the K-space center as $M_c$.

The determination unit (comparator) 332 is configured to compare $M_c$ with $M_{nin}$, send a first processing notification to the second processor 333 if $M_c \leq M_{nin}$, and send a second processing notification to the third processor 334 if $M_c > M_{nin}$.

The second processor 333 is configured to reduce the flip angle of the fat-suppression pulse at the set intervals according to the first processing notification and calculate fat signals in all echoes within an echo train length until the fat signal at $M_c$ is the minimum or sufficiently close to the minimum, and the flip angle of the corresponding fat-suppression pulse at this time is the final flip angle.

The third processor 334 is configured to reduce the echo train length according to the second processing notification, obtain the reduced echo train length M according to formula (8), and instruct the first processor 331 to perform the operations of setting of the flip angle of the fat-suppression pulse to 180° based on the reduced echo train length and calculating fat signals in all echoes within a fat-suppression echo train length M.

The magnetic resonance imaging device in the embodiments of the present disclosure may comprise the data acquisition device shown in FIG. 3, and may further comprise other necessary modules, for example, an image reconstruction processor configured to utilize data in the K-space to reconstruct a magnetic resonance image, on the basis of the data acquisition device shown in FIG. 3.

The embodiments of the devices of the present disclosure have been described in detail above, and the embodiments of the method of the present disclosure will be described in detail below. For the details not disclosed in the embodiments of the method of the present disclosure, refer to the corresponding description in the embodiments of the devices of the present disclosure. These details will not be described here again.

Figure 8:
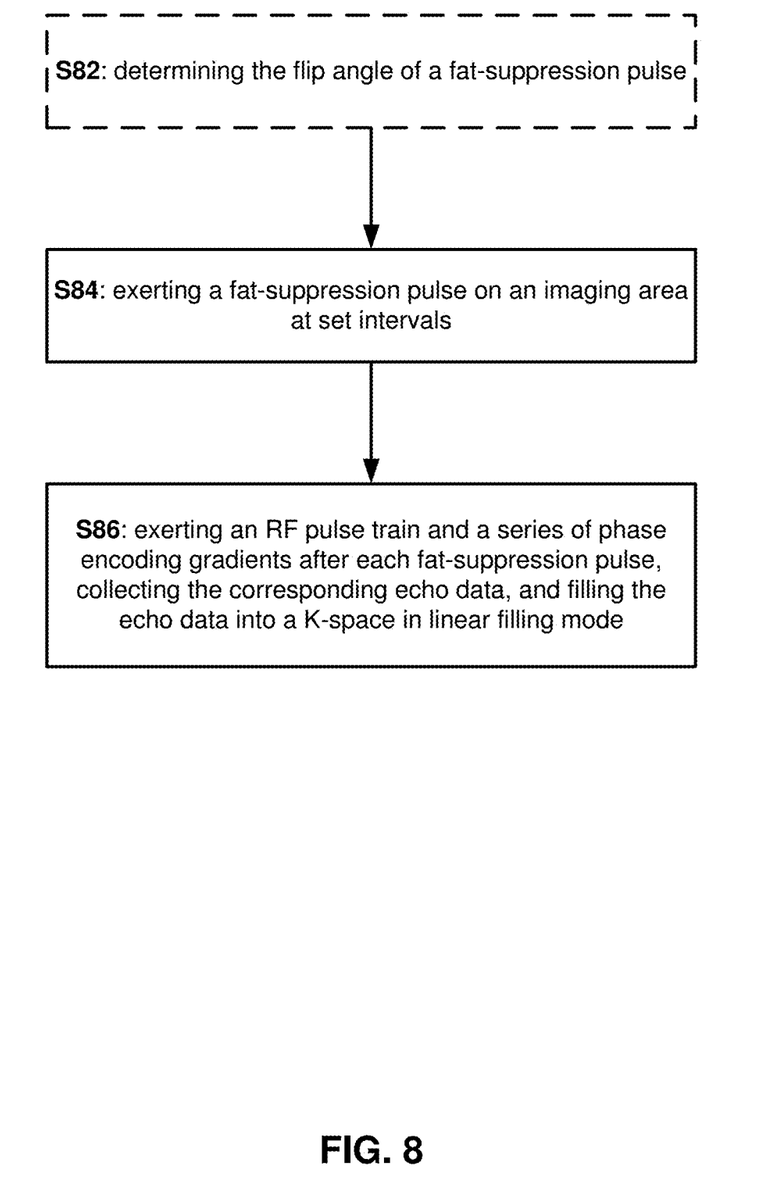
FIG. 8 is a flowchart of a data acquisition method according to an exemplary embodiment.

FIG. 8 is an exemplary flowchart of a data acquisition method in the embodiments of the present disclosure. As indicated by solid line boxes in FIG. 8, the method may comprise:

Step S84: exerting a fat-suppression pulse on an imaging area at set intervals. The fat-suppression pulse is able to suppress an initial fat signal to a negative value and keep the fat signal corresponding to the intermediate echo datum of the echo data collected between two fat-suppression pulses at 0 or close to 0, for example, keep the fat signal corresponding to the intermediate echo datum of the echo data collected between two fat-suppression pulses within [0, a], and a is a preset threshold close to 0, for example, 0.1, and Step S86: exerting an RF pulse train and a series of phase encoding gradients after each fat-suppression pulse, collecting the corresponding echo data, and filling the echo data into a K-space in linear filling mode.

In addition, in another implementation mode, as indicated by the dotted-line box in FIG. 7, the method further comprises Step S82: determining the flip angle of a fat-suppression pulse by following the principle that the fat signal corresponding to the intermediate echo datum of the echo data collected between the two fat-suppression pulses is 0 or close to 0. Accordingly, a fat-suppression pulse having the flip angle is exerted in an imaging area at first set intervals in Step S84.

Figure 9:
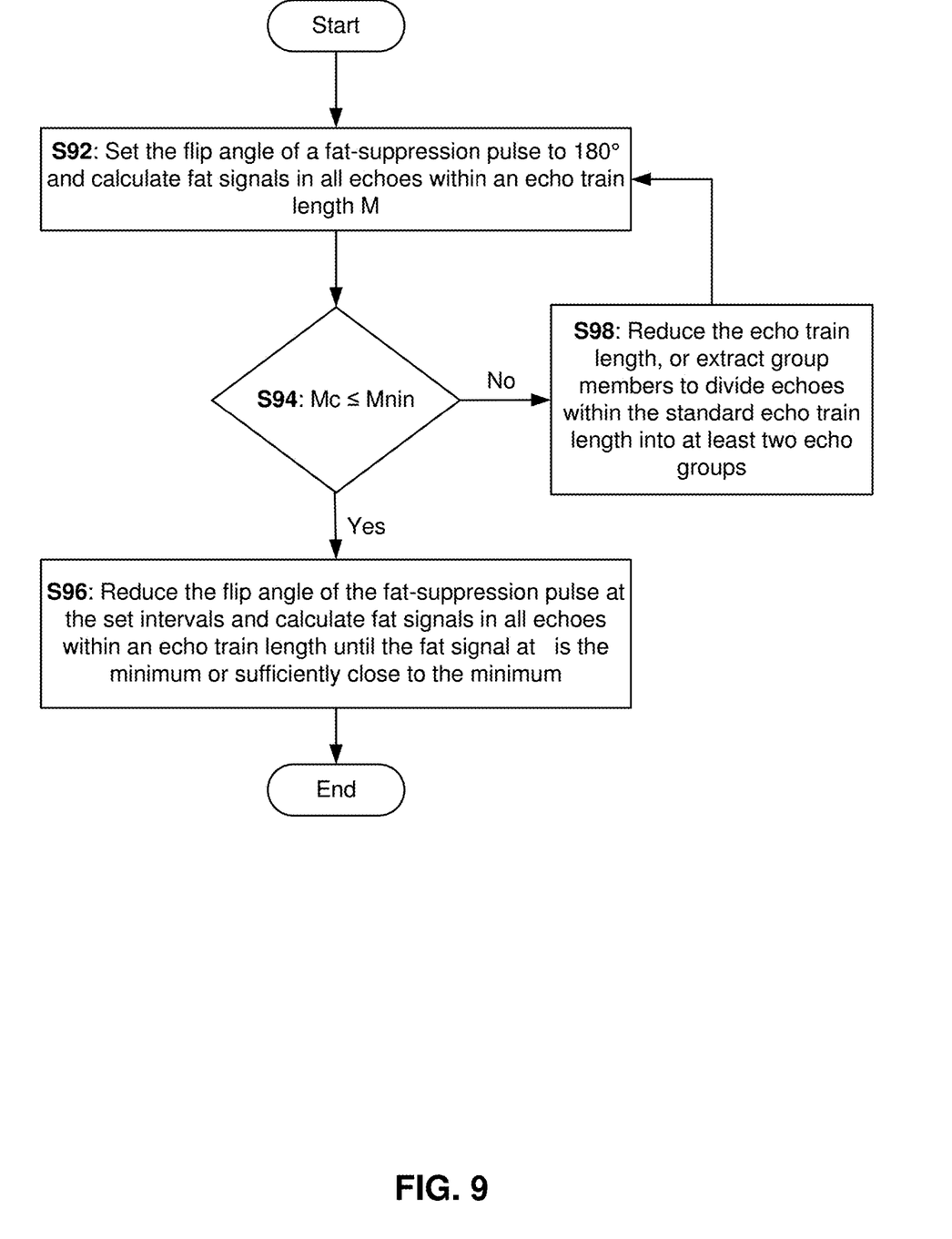
FIG. 9 is a flowchart of a method for determining the flip angle of a fat-suppression pulse according to an exemplary embodiment.

In one example of the present disclosure, when Step S82 is specifically performed, the process of determining the flip angle of a fat-suppression pulse may comprise the following steps, as shown in FIG. 9:

Step S92: Set the flip angle of a fat-suppression pulse to 180° and calculate fat signals in all echoes within an echo train length M.

Step S94: Compare the echo number $M_c$ corresponding to the K-space center with the echo No. $M_{min}$ of the lowest fat signal, and if $M_c \leq M_{min}$, perform Step S96, and otherwise perform Step S98, that is to say, if $M_c > M_{min}$, perform Step S98.

In the present embodiment, the echo No. of the lowest fat signal is marked as $M_{min}(R_0)$, and the echo No. corresponding to the K-space center is marked as $M_c$.

Step S96: Reduce the flip angle of the fat-suppression pulse at the set intervals and calculate fat signals in all echoes within an echo train length until the fat signal at $M_c$ is the minimum or sufficiently close to the minimum. The flip angle of the corresponding fat-suppression pulse at this time is the final flip angle.

Step S98: Reduce the echo train length, obtain the reduced echo train length M according to formula (8)

$$M = \frac{M_{ETL}}{n}, (n = 1, 2, 3, \ldots),$$

alternately extract group members to divide echoes within the standard echo train length $M_{ETL}$ into at least two echo groups, and then go back to Step S92.

In Step S98, the above-mentioned echo train length is reduced by multiples. In order to match the existing K-space and keep the intermediate echo datum of echo data within the reduced echo train length located at the center of the K-space, group members are alternately extracted at equal intervals according to the reduction multiple of the echo train length to divide the echoes within the normal echo train length into corresponding echo groups, namely, at least two echo groups, usually two echo groups or three echo groups. For example, if n=2, the original ETL is 10 and the echoes in the ETL of 10 are divided into two groups, one echo group may consist of the first, third, fifth, seventh and ninth echoes, and the other echo group may consist of the second, fourth, sixth, eighth and tenth echoes. For example again, if n=3, the ETL is 15 and the echoes within the ETL of 15 are divided into three groups, then the first echo group may consist of the first, fourth, seventh, tenth and thirteenth echoes, the second echo group may consist of the second, fifth, eighth, eleventh and fourteenth echoes, and the third echo group may consist of the third, sixth, ninth, twelfth and fifteenth echoes. After that, the flip angle of the fat-suppression pulse exerted before each echo group is so calculated for the echo group that the fat signal corresponding to the intermediate echo datum of echo data in the echo group is 0 or close to 0.

In Step S92 and Step S96, calculating fat signals in all echoes within an echo train length is calculating fat signals in all echoes within an echo train length according to formulas (1) to (5):

An experiment was performed below to verify the implementation effect of the technical solution in the embodiments of the present disclosure.

In the experiment, the Siemens 3T magnetic spectrum system (16-channel) was used and a 16-channel head/neck coil was used to detect the head of a volunteer. Protocol parameters used: TE/TR=2.47/6.42 ms, BW=250 Hz. FOV=173×190, Matrix 230×288, slices per slab=56, slice OS=28.6%, voxel=0.7×0.7×1.0 mm, Q-fat sat, lines per shot=60, FA=9.

The above-mentioned protocol parameters are explained as follows:

TE—echo time in ms,
TR—repetition time in ms,
BW—sampling bandwidth in Hz,
FOV—field of view in mm,
Matrix—size of a sampling matrix,
slices per slab—number of codes in a layer selection direction per image slab,
voxel—voxel in mm,
Q-fat sat—quick fat saturation
Lines per shot—number of lines sampled after a fat suppression,
FA—flip angle in °.

FIG. 9 shows MRI images of a volunteer. The first column is an MRI image obtained by using the pseudo-intermediate sequence filling mode shown in FIG. 2C for data acquisition, and the second column is an MRI image obtained by using the linear filling mode in the embodiments of the present disclosure for data acquisition.

From the comparisons of MRI images in different sorting modes in FIG. 9, it can be learned that for the same parameter settings, data acquisition in linear filling mode in the embodiments of the present disclosure has a better fat signal suppression effect than data acquisition in pseudo-intermediate sequence filling mode. Thus, fat signals in eye sockets are further suppressed so that the visual nerves in the reconstructed image are more highlighted and clearer.

From the above-mentioned solution, it can be seen that in the embodiments of the present disclosure, a fat-suppression pulse suppressing fat signals to zero or a value close to zero is exerted when the intermediate echo datum is collected, that is to say, the fat-suppression pulse first suppresses fat signals to a set negative value, instead of zero, and then an RF pulse train is exerted during the period of the suppression of fat signals and the recovery to a set positive value. In this way, echo data of low fat signals L is just located at the central area of a K-space at the time of linear filling of the K-space. In addition, since fat signals are mainly located near a zero value, the fat suppression effect is better than that of a solution based on the increase of fat signals of an existing fat-suppression pulse from a zero value to a first positive value or a solution based on the increase of fat signals of a new fat-suppression pulse from a negative value to a second positive value.

In addition, when the flip angle of a fat-suppression pulse is calculated for echoes within the normal echo train length (ETL), if the condition that the corresponding fat signal of the intermediate echo datum is 0 or close to 0 cannot be satisfied, the ETL is reduced, group members are alternately extracted to divide the echoes within the normal echo train length (ETL) into at least two echo groups, and the flip angle of the fat-suppression pulse exerted for each echo group can be obtained.

The above-mentioned embodiments are only preferred embodiments of the present disclosure, but are not used to restrict the present disclosure. Without departing from the spirit and principle of the present disclosure, modifications, equivalent replacements, and improvements should all fall within the scope of protection of the present disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

101, 106 Fat-suppression pulse
102 Exciting pulse
103 Spoiled gradient
104 Echo data
105, 107 Fat signal
310 Fat-suppression pulse exertion module (Fat-suppression pulse exertion generator)
320 Excitation and acquisition module (Excitation and acquisition generator)
330 Fat-suppression pulse determination processor
331 First processor
332 Determination unit (comparator)
333 Second processor
334 Third processor
S82, S84, S86, S92, S94, S96, S98 Step

The invention claimed is:

1. A data acquisition device, comprising:
a fat-suppression pulse exertion generator configured to exert a fat-suppression pulse on an imaging area at set intervals to suppress an initial fat signal to a negative value and maintain the fat signal corresponding to the intermediate echo datum of echo data collected between two fat-suppression pulses within [0, a], wherein a is a preset threshold close to 0;
a fat-suppression pulse determination processor configured to determine a flip angle of a fat-suppression pulse based on a principle that the fat signal corresponding to the intermediate echo datum of the echo data collected between the two fat-suppression pulses is kept within [0, a], the fat-suppression pulse exertion generator being configured to exert the fat-suppression pulse having the flip angle on the imaging area at the set intervals; and
an excitation and acquisition generator configured to exert an RF pulse train and a series of phase encoding gradients after each fat-suppression pulse, collect the corresponding echo data, and fill the echo data into K-space in a linear filling mode, wherein the fat-suppression pulse determination processor comprises:
a first processor configured to set the flip angle of a fat-suppression pulse to 180° and calculate fat signals in all echoes within an echo train length;
a comparator configured to:
compare an echo number $M_{min}$ of a lowest fat signal with an echo number $M_c$ corresponding to a K-space center,
provide a first processing notification to a second processor in response to $M_c \leq M_{min}$, and
provide a second processing notification to a third processor in response to $M_c > M_{min}$;
the second processor configured to reduce the flip angle of the fat-suppression pulse at the set intervals according to the first processing notification and calculate fat signals in all echoes within an echo train length until the fat signal at $M_c$ is minimized, the flip angle of the corresponding fat-suppression pulse at this time is a final flip angle; and
the third processor configured to:
reduce the echo train length according to the second processing notification, or
extract group members to divide the echoes within the standard echo train length into at least two echo groups, instruct the first processor to set the flip angle of the fat-suppression pulse to 180° based on the reduced echo train length, and calculate fat signals in all echoes within a fat-suppression echo train length M.

2. A data acquisition method, comprising:

exerting a fat-suppression pulse on an imaging area at set intervals to suppress an initial fat signal to a negative value and maintain the fat signal corresponding to the intermediate echo datum of the echo data collected between two fat-suppression pulses within [0, a], wherein a is a preset threshold close to 0;

before exerting the fat-suppression. pulse on the imaging area at set intervals, determining the flip angle of a fat-suppression pulse based on a principle that the fat signal corresponding to the intermediate echo datum of the echo data collected between the two fat-suppression pulses is kept within [0, a], wherein exerting the fat-suppression pulse on the imaging area at set intervals includes exerting the fat-suppression pulse having the flip angle on the imaging area at set intervals, wherein determining the flip angle includes:

setting the flip angle of a fat-suppression pulse to 180° and calculating fat signals in all echoes within an echo train length M;

reducing the flip angle of the fat-suppression pulse at the set intervals when an echo number $M_c$ corresponding to the K-space center is less than or equal to an echo number $M_{min}$ of the lowest fat signal, and calculating fat signals in all echoes within an echo train length until the fat signal at $M_c$ is the minimum or sufficiently close to the minimum, and the flip angle of the corresponding fat-suppression pulse at this time is the final flip angle; and reducing the echo train length and alternately extracting group members to divide the echoes within the standard echo train length into at least two echo groups when the echo number $M_c$ corresponding to the K-space center is greater than the echo number $M_{min}$ of the lowest fat signal, and then returning to setting the flip angle of a fat-suppression pulse to 180° and calculating fat signals in all echoes within an echo train length M; and exerting a radio frequency (RF) pulse train and a series of phase encoding gradients after each fat-suppression pulse, collecting corresponding echo data, and filling the echo data into K-space in a linear filling mode.

3. The data acquisition device as claim 1, wherein, in response to the fat signal corresponding to the intermediate echo datum being outside [0, a] in the determination of the flip angle, the fat-suppression pulse determination processor is configured to calculate the flip angle of the fat-suppression pulse for each echo group.

4. The data acquisition device as claimed in claim 1, wherein calculating fat signals in all echoes within an echo train length is calculating fat signals in all echoes within an echo train length according to the following formulas:

$$Mz_n^+ = Mz_n^- * \cos(\beta)$$

$$Mz_{e1}^- = Mz_n^+ * e^{-\frac{t1}{T1}} + M_0(1 - e^{-\frac{t1}{T1}})$$

$$Mz_{ei}^- = Mz_{ei-1}^- * \cos(\theta)e^{-\frac{t3}{T1}} + M_0(1 - e^{-\frac{t3}{T1}})$$

$$Mz_{ei}^+ = Mz_{ei}^- * \cos(\theta)$$

$$M_{xy}^{ei} = Mz_{ei}^+ * \sin(\theta) * e^{-\frac{t2}{T2}}$$

wherein i=2,3, . . . ,m; β is the flip angle of a fat-suppression pulse, θ is the excitation angle of an exciting pulse, $Mz_n^-$ is the longitudinal magnetization vector of fat at the $n^{th}$ point of time, $Mz_n^+$ is obtained after flipping $Mz_n^-$ a flip angle β, $Mz_{ei}^-$ is the longitudinal magnetization vector of fat at the $i^{th}$ RF pulse, $Mz_{ei}^+$ is obtained after flipping $Mz_{ei}^-$ an excitation angle θ; T1 is the longitudinal relaxation time of fat, T2 is the transverse relaxation time of fat, t1 is the time interval between the fat-suppression pulse and a first RF pulse, t2 is the echo time, and t3 is the echo interval; and $M_0$ is the magnetization vector in a thermal equilibrium state, $M_{xy}^{ei}$ is the transverse magnetization vector of fat at the $i^{th}$ echo datum, and m is the echo train length.

5. A magnetic resonance imaging device, characterized in that the device comprises the data acquisition device according to claim 1.

6. The data acquisition method as claimed in ciaim 2, wherein calculating fat signals in all echoes within an echo train length is calculating fat signals in all echoes within an echo train length according to the following formulas:

$$Mz_n^+ = Mz_n^- * \cos(\beta)$$

$$Mz_{e1}^- = Mz_n^+ * e^{-\frac{t1}{T1}} + M_0(1 - e^{-\frac{t1}{T1}})$$

$$Mz_{ei}^- = Mz_{ei-1}^- * \cos(\theta)e^{-\frac{t3}{T1}} + M_0(1 - e^{-\frac{t3}{T1}})$$

$$Mz_{ei}^+ = Mz_{ei}^- * \cos(\theta)$$

$$M_{xy}^{ei} = Mz_{ei}^+ * \sin(\theta) * e^{-\frac{t2}{T2}}$$

wherein i=2,3, . . . ,m; β is the flip angle of a fat-suppression pulse, θ is the excitation angle of an exciting pulse, $Mz_n^-$ is the longitudinal magnetization vector of fat at the $n^{th}$ point of time, $Mz_n^+$ is obtained after flipping $Mz_n^-$ a flip angle β, $Mz_{ei}^-$ is the longitudinal magnetization vector of fat at the $i^{th}$ RF pulse, $Mz_{ei}^+$ is obtained after flipping $Mz_{ei}^-$ an excitation angle θ; T1 is the longitudinal relaxation time of fat, T2 is the transverse relaxation time of fat, t1 is the time interval between the fat-suppression pulse and a first RF pulse, t2 is the echo time, and t3 is the echo interval; and $M_0$ is the magnetization vector in a thermal equilibrium state, $M_{xy}^{ei}$ is the transverse magnetization vector of fat at the $i^{th}$ echo datum, and m is the echo train length.

7. A non-transitory computer-readable storage medium with an executable program stored thereon, that when executed, instructs a processor to perform the method of claim 2.

* * * * *